(12) United States Patent
Hsu (10) Patent No.: US 7,274,227 B2
(45) Date of Patent: Sep. 25, 2007

(54) POWER-ON RESET CIRCUIT

(75) Inventor: Po-Chin Hsu, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 13 days.

(21) Appl. No.: 11/161,260

(22) Filed: Jul. 28, 2005

(65) Prior Publication Data
US 2006/0109037 A1   May 25, 2006

(30) Foreign Application Priority Data
Nov. 25, 2004   (TW)   ................. 93136261 A (51) Int. Cl.
*H03L 7/00* (2006.01)
*H03K 3/02* (2006.01)

(52) U.S. Cl. ............ 327/143; 327/198
(58) Field of Classification Search ........... 327/143, 327/198
See application file for complete search history.

(56) References Cited

U.S. PATENT DOCUMENTS

| | | | |
|---|---|---|---|
| 5,386,152 A | 1/1995 | Naraki | 327/143 |
| 6,388,479 B1 | 5/2002 | Gupta et al. | 327/143 |
| 6,650,155 B1* | 11/2003 | Nguyen et al. | 327/143 |
| 6,784,705 B2* | 8/2004 | Kamata | 327/143 |
| 6,911,852 B2* | 6/2005 | Matsushita | 327/143 |
| 6,972,602 B2* | 12/2005 | Akamatsu et al. | 327/143 |
| 6,982,577 B2* | 1/2006 | Sekino et al. | 327/143 |
| 2001/0028263 A1 | 10/2001 | Ohbayashi et al. | 327/143 |

* cited by examiner

*Primary Examiner*—Quan Tra
*Assistant Examiner*—Rey Aranda
(74) *Attorney, Agent, or Firm*—Jianq Chyun IP Office (57) ABSTRACT

A power-on reset circuit is provided. The power-on reset circuit includes an adjusting circuit, a charging/discharging unit and an output circuit. The adjusting circuit receives and adjusts a clock signal so as to output a control signal, wherein a minimum level of the control signal is clamped to be higher than a pre-defined level. The charging/discharging unit having a capacitor apparatus receives the control signal, determines whether to charge/discharge the capacitor apparatus based on the control signal, and outputs a storage voltage of the capacitor apparatus. The output circuit receives the storage voltage and outputs the reset signal. Wherein, the adjusting circuit determines the charging/discharging duty cycle of the charging/discharging unit by adjusting the waveform and the minimum level of the control signal. The output circuit enables/disables the reset signal according to whether the storage voltage reaches the threshold voltage of the output circuit.

16 Claims, 8 Drawing Sheets

POWER-ON RESET CIRCUIT

CROSS-REFERENCE TO RELATED APPLICATION

This application claims the priority benefit of Taiwan application serial no. 93136261, filed on Nov. 25, 2004. All disclosure of the Taiwan application is incorporated herein by reference.

BACKGROUND OF THE INVENTION

1. Field of the Invention

The present invention relates to a circuit for generating a reset signal, and more particularly to a power-on reset circuit.

2. Description of the Related Art

For design of electronic circuits, a reset mechanism is normally added in these circuits so that these circuits can come back to an initial condition when necessary. Particularly at the beginning these electronic circuits being turned on, devices, such as registers, in these circuits are not stable, it is essential to reset the circuit to let these devices of these circuits be back to the initial condition.

Figure 1A:
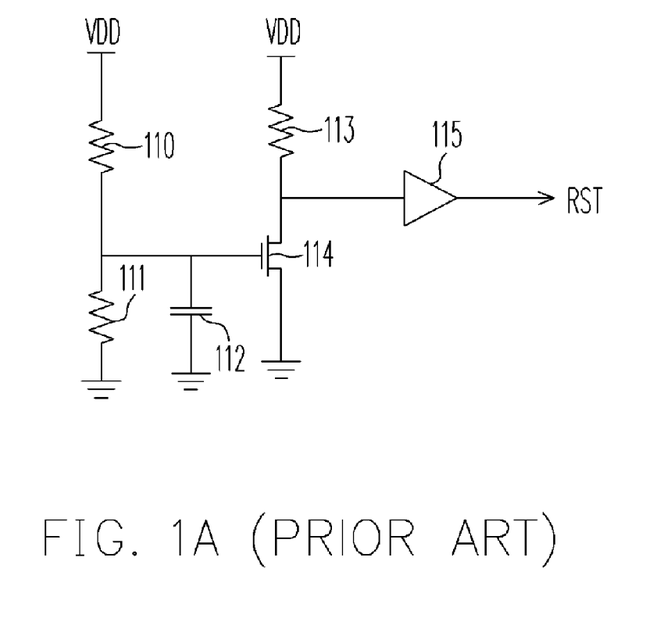
FIG. 1A is a drawing showing a traditional power-on reset circuit.

Accordingly, a circuit is required to generate a reset signal at the beginning of the turn on of the circuit so that the state of the electronic circuit is in the initial condition. FIG. 1A is a drawing showing a traditional power-on reset circuit. Referring to FIG. 1A, when the power is not turned on, charges stored in the capacitor 112 are discharged through the resistor 111. At the beginning of the turn on of the power, the N-type transistor 114 is cut off. Accordingly, the power-on reset circuit in FIG. 1A can generate the reset signal RST by the pull-up resistor 113 and the buffer 115. A current is then provided through the resistor 110 to charge the capacitor 112 to result in the gate voltage of the transistor is higher than its threshold voltage. Then, the transistor 114 is turned on and disables the reset signal RST.

In order to make sure all devices can be reset, the time period of the enable reset signal of the power-on reset circuit must be long enough. In other words, the resistance-capacitance (RC) time delay formed by the resistor 110 and the capacitor 112 in FIG. 1A must be great enough. Accordingly, a big chip size is required. Moreover, the resistor 111 forms a leakage route that consumes unnecessary power.

Figure 1B:
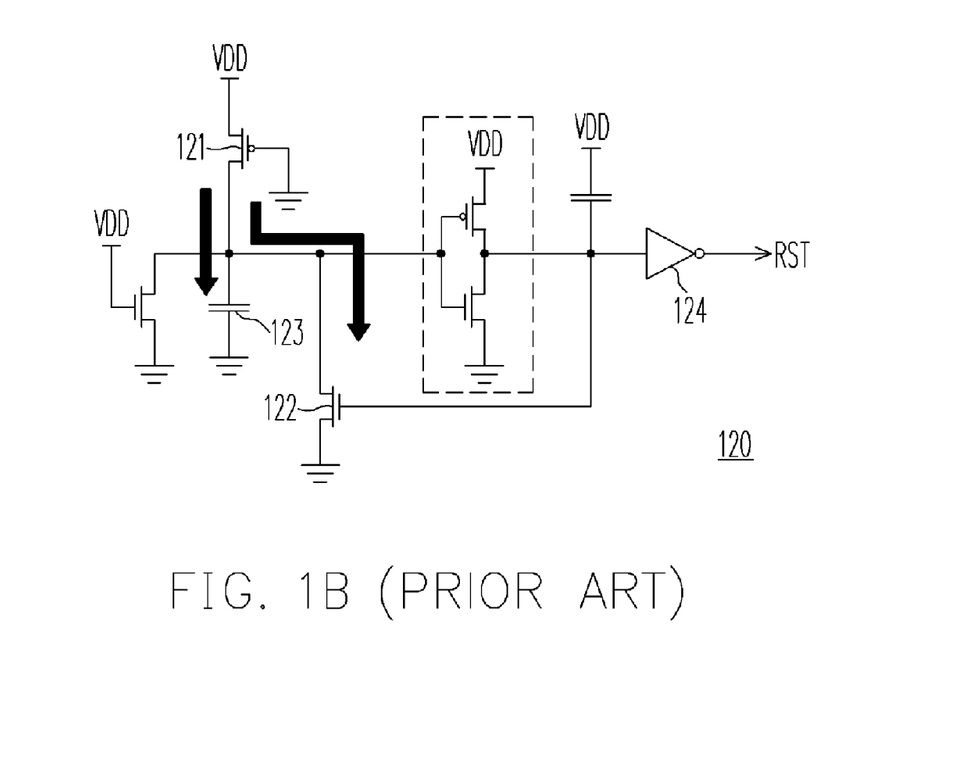
FIG. 1B is a drawing showing a power-on reset circuit disclosed in U.S. Published Patent No. 2001/0028263 A1.

U.S. Published Patent No. 2001/0028263 A1 titled "Power on reset circuit", published on Oct. 11, 2001, discloses a power-on reset circuit as shown in FIG. 1B. In the power-on reset circuit 120, currents flowing through the transistor 121 are divided to the capacitor 123 and the transistor 122. Accordingly, the charging time of the capacitor 123 can be extended. The charge potential of the capacitor 123 can change the status of the inverter 124 to perform power-on reset. However, it is required to precisely control the current flowing through the transistor 122. If the current is too small, the time period of the reset signal cannot be enough; if the current is too large, the capacitor cannot be charged to the level that will change the status of the inverter 124. Moreover, the charging/discharging process will consume more power.

Figure 1C:
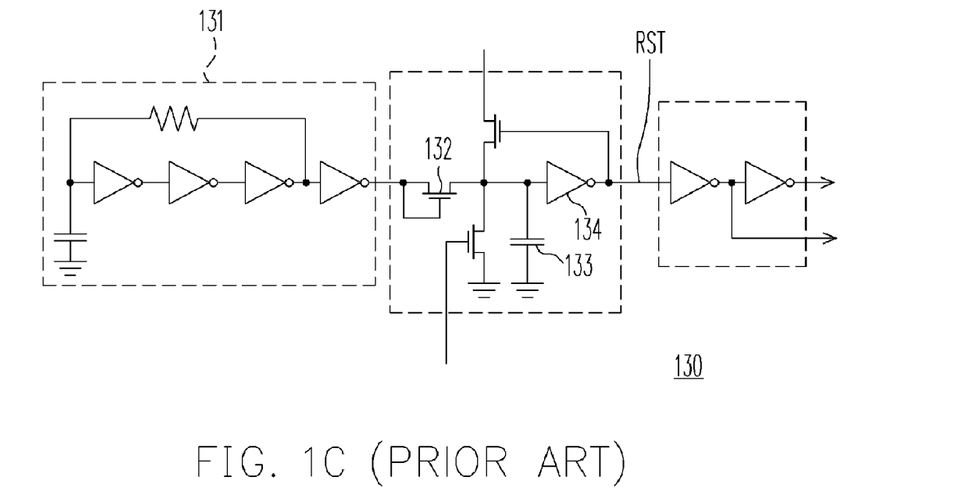
FIG. 1C is a power-on reset circuit disclosed in U.S. Pat. No. 6,388,479 titled "Oscillator based power-on reset circuit".

FIG. 1C is a power-on reset circuit disclosed in U.S. Pat. No. 6,388,479 titled "Oscillator based power-on reset circuit" on May 14, 2002. Referring to FIG. 1C, in the power-on reset circuit 130, the clock signal output from the oscillation circuit 131 passes directly through the transistor 132 and the capacitor 133 to affect the potential of the capacitor 133. When the potential of the capacitor 133 reaches the transitional critical point of the inverter 134, the power-on reset is performed. However, the RC time delay formed by the resistor of the transistor 132 and the capacitor 133 must be larger than the pulse width of the clock signal output from the oscillation circuit 131, otherwise the reset cannot be performed. In addition, the reset signal RST output from the power-on reset circuit 130 has the oscillation effect.

Figure 1D:
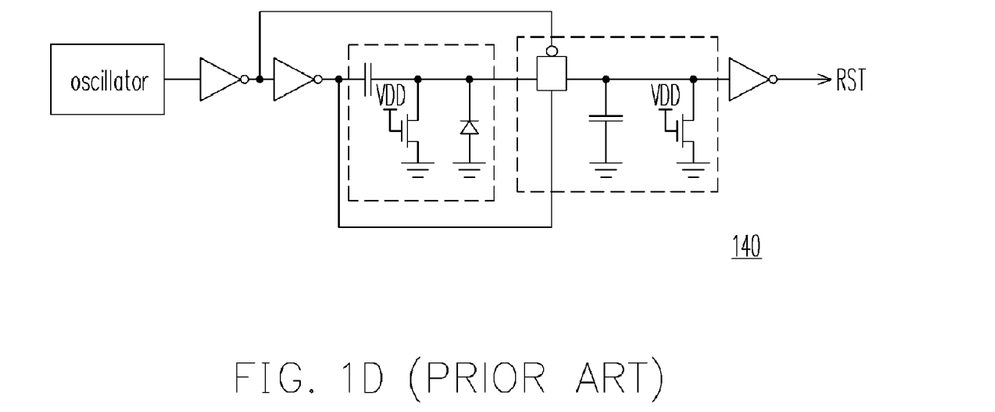
FIG. 1D is a power-on reset circuit disclosed in U.S. Pat. No. 5,386,152 titled "Power-on reset circuit responsive to a clock signal".

FIG. 1D is a power-on reset circuit disclosed in U.S. Pat. No. 5,386,152 titled "Power-on reset circuit responsive to a clock signal" on Jan. 31, 1995. Referring to FIG. 1D, in the power-on reset circuit 140, the charge/discharge signal provided from the positive/negative edge-triggered differentiator of the clock amplifier. Diodes are required to protect the circuit from the great reverse signal flowing from the ground terminal to the circuit. Accordingly, this circuit will generate noises through the substrate. In addition, the reset signal RST output from the power-on reset circuit 130 also has the oscillation effect.

Figure 2:
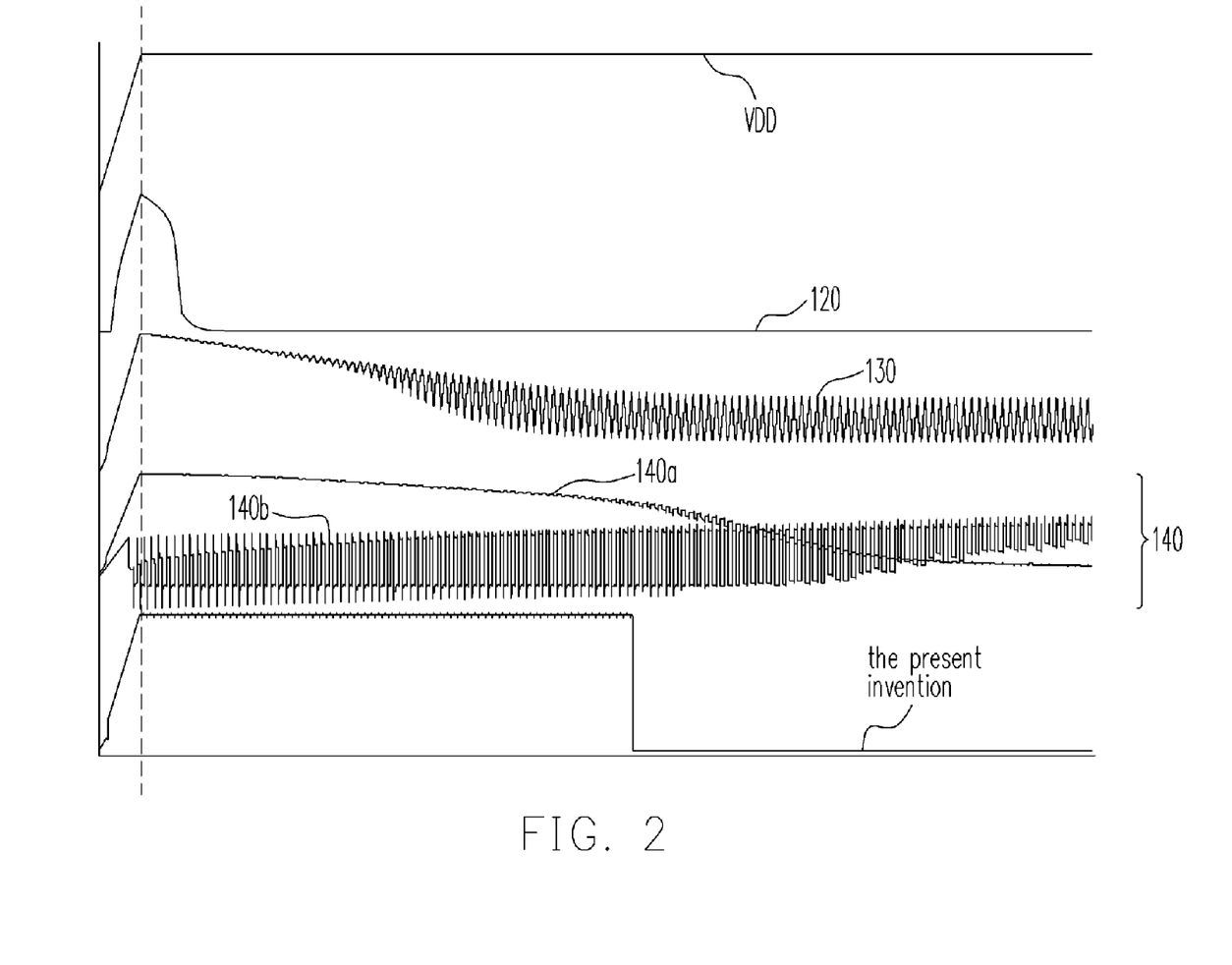
FIG. 2 is a drawing showing the sequences of the power-on reset circuits of the prior arts described above and the present invention.

FIG. 2 is a drawing showing the sequences of the power-on reset circuits of the prior arts described above and the present invention. Referring to FIG. 2, from top to bottom, the first line represents the power voltage VDD. The left side of the lines represents the transient changes when the power is turned on. The second line 120, the third line 130 and the fourth line 140 represent the reset signals output from the power-on reset circuits 120, 130 and 140, respectively. In this figure, with the same resistor and capacitor, the reset time period of the power-on reset circuit 120 is not sufficient. Though the reset time period output from the power-on reset circuit 130 is longer, there is a serious oscillation effect. The line 140a of the fourth line 140 represents the reset signal output from the power-on reset circuit 140. It still has the oscillation effect. In addition, the line 140b of the fourth line 140 shows that the signal with a voltage lower than the ground voltage in the internal of the power-on reset circuit 140.

SUMMARY OF THE INVENTION

Accordingly, the present invention is directed to a power-on reset circuit to reduce the capacitance and capacitor area of the resistance-capacitance (RC) time delay, and to reduce current consumption. In addition, the capacitor charging direction in determining the RC time delay is fixed, so the system operation is stable and noises are reduced.

The present invention provides a power-on reset circuit to generate a reset signal when the power is initially turned on. The power-on reset circuit comprises an adjusting circuit, a charging/discharging unit, and an output circuit. The adjusting circuit receives and adjusts a clock signal to output a control signal, wherein a lowest level of the control signal is higher than a pre-defined level. The charging/discharging unit comprises a capacitor apparatus. The charging/discharging unit is coupled to the adjusting circuit to receive the control signal and determine whether to charge or discharge the capacitor apparatus based on the control signal so as to output a storage voltage of the capacitor apparatus. The output circuit is coupled to the charging/discharging unit to receive the storage voltage and to output the reset signal. Wherein, the adjusting circuit determines a duty cycle of the charging/discharging unit by adjusting a waveform and the lowest level of the control signal. The output circuit enables or disables the reset signal according to whether the storage voltage reaches a critical voltage of the output circuit.

According to the power-on reset circuit of a preferred embodiment of the present invention, the power-on reset circuit further comprises a control switch. The control switch comprises a first terminal, a second terminal, and a control terminal. According to the reset signal received by the control terminal, the control switch determines whether to transmit the clock signal received by the first terminal to the second terminal, and to output the clock signal to the adjusting circuit. Wherein, the control switch can be a transmission gate.

According to the power-on reset circuit of a preferred embodiment of the present invention, the adjusting circuit comprises a wave-shaping circuit and a first clamp circuit. The wave-shaping circuit shapes the clock signal received by the wave-shaping circuit to output the control signal. The first clamp circuit is coupled to the wave-shaping circuit to restrain the lowest level of the control signal to be higher than the pre-determined level.

According to the power-on reset circuit of a preferred embodiment of the present invention, the wave-shaping circuit comprises: a first transistor, a second transistor, and a first capacitor. A gate of the first transistor receives the clock signal, a first source/drain of the first transistor is coupled to a first voltage, and a second source/drain of the first transistor outputs the control signal. A gate of the second transistor receives the clock signal, a first source/drain of the second transistor is coupled to the second source/drain of the first transistor, and a second source/drain of the second transistor is coupled to the first clamp circuit. A terminal of the first capacitor is coupled to the first voltage, and another terminal of the first capacitor is coupled to the second source/drain of the first transistor. Wherein, the first voltage can be, for example, a system voltage.

According to the power-on reset circuit of a preferred embodiment of the present invention, the first clamp circuit comprises: a third transistor and a fourth transistor. A gate and a first source/drain of the third transistor are coupled to the wave-shaping circuit. A gate of the fourth transistor receives the clock signal, a first source/drain terminal of the fourth transistor is coupled to a second source/drain of the third transistor, and a second source/drain of the fourth transistor is coupled to a second voltage. Wherein, the second voltage can be, for example, a ground voltage.

According to the power-on reset circuit of a preferred embodiment of the present invention, the charging/discharging unit comprises: a fifth transistor, a sixth transistor, and a third capacitor. A gate of the fifth transistor receives the control signal, and a first source/drain terminal of the fifth transistor is coupled to a first voltage. A gate of the sixth transistor is coupled to the first voltage, a first source/drain of the sixth transistor is coupled to a second source/drain of the fifth transistor, and a second source/drain terminal of the sixth transistor is coupled to a second voltage. A first terminal of the third capacitor is coupled to the second source/drain of the fifth transistor and outputs the storage voltage. And a second terminal of the third capacitor is coupled to the second voltage.

According to the power-on reset circuit of a preferred embodiment of the present invention, the power-on reset circuit further comprises a low-voltage reset circuit. The low-voltage reset circuit receives the reset signal and the storage voltage of the capacitor apparatus to provide an electrical route when a system voltage is lower than a pre-determined level so as to charge/discharge the capacitor apparatus to come back to an initial condition.

According to the power-on reset circuit of a preferred embodiment of the present invention, the low-voltage reset circuit comprises: a seventh transistor, an eighth transistor, a ninth transistor, a buffer and a second clamp circuit. A gate of the seventh transistor receives the reset signal, and a first source/drain of the seventh transistor is coupled to the first terminal of the third capacitor. A gate of the eighth transistor receives the first voltage, and a first source/drain of the eighth transistor is coupled to a second source/drain of the seventh transistor. A first source/drain of the ninth transistor is coupled to the first terminal of the third capacitor, and a second source/drain of the ninth transistor is coupled to a second voltage. An input terminal of the buffer is coupled to a second source/drain of the eighth transistor, and an output terminal of the buffer is coupled to a gate of the ninth transistor. A first terminal of the clamp circuit is coupled to the second source/drain of the eighth transistor, and a second terminal of the second clamp circuit is coupled to the second voltage.

The present invention uses the clock signal and the reset of the signal to effectively control the switch time of resistors or transistors so as to extend the turn-on time of the power-on reset circuit. The present invention adjusts amplitudes and period time of the clock signals. The control of the amplitudes of the clock signals is related to the turn-on voltage of the transistor. The control of the period time of the clock signals is performed by shaping waveforms of the amplitude-restricted clock signal with about, for example, 50% duty cycle into the control signals which can turn on the route with the transistor in a shorter time, such as smaller than 50% duty cycle. Accordingly, the RC time delay formed by a small resistance and a small capacitor area can be achieved. Due to elimination of the current leakage route in the operation, the leakage consumption can be reduced. Moreover, the charging direction for determining the time constant is fixed, so no reverse signals will enter into the circuit from the ground terminal. Noises passing through the substrate can be prevented.

The above and other features of the present invention will be better understood from the following detailed description of the preferred embodiments of the invention that is provided in communication with the accompanying drawings.

DESCRIPTION OF SOME EMBODIMENTS

Figure 3A:
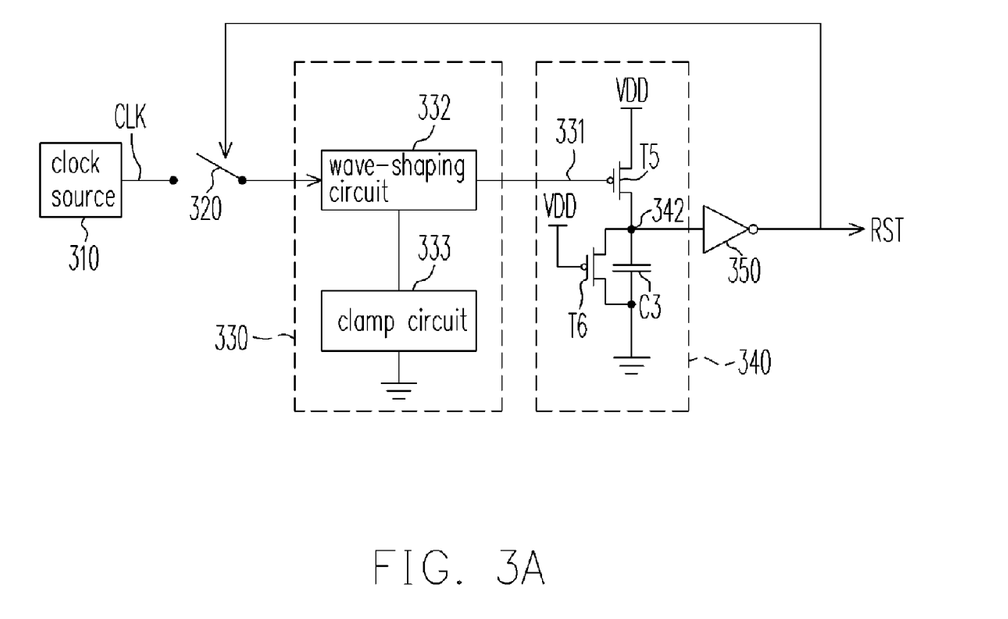
FIG. 3A is a power-on reset circuit according to an embodiment of the present invention.

FIG. 3A is a power-on reset circuit according to an embodiment of the present invention. Referring to FIG. 3A, the clock source 310 generates a clock signal CLK. The control switch 320 comprises a first connection terminal, a second connection terminal, and a control terminal. The control switch 320 determines whether to transmit the clock signal CLK received by the first connection terminal to the second connection terminal and to output the clock signal CLK to the adjusting circuit 330 according to the reset signal RST. In this embodiment, it is assumed that the initial condition of the control switch 320 is turn-on.

The adjusting circuit 330 receives and adjusts the clock signal CLK to output the control signal 331. In this embodiment, the adjustment of the signal comprises restricting the amplitude and the time of the clock signal CLK. Wherein, the restriction of the amplitude is related to the turn-on voltage for controlling charge/discharge. For example, the clamp circuit 333 of the adjusting circuit 330 restricts the lowest level of the control signal 331 to be higher than the pre-determined level. The restriction of time shapes the waveform of the amplitude-restricted clock signal CLK into the control signal 331, which turns on the charging/discharging route with a shorter time. For example, the wave-shaping circuit 332 of the adjusting circuit 330 shapes the waveform of the received clock signal CLK into the control signal 331 with a smaller duty cycle.

The charging/discharging unit 340 comprises a capacitor apparatus, such as a capacitor C3. The charging/discharging unit 340 receives the control signal 331 and determines whether to charge/discharge the capacitor apparatus according to the control signal 331. The charging/discharging unit 340 then outputs the storage voltage 342 of the capacitor apparatus. In this embodiment, the charging/discharging unit 340 comprises a P-type transistor T5 and the capacitor C3. As described above, the control signal 331 outputted from the adjusting circuit 330 is a pulse signal with a smaller duty cycle. The gate of the transistor T5 receives the control signal 331 to periodically turn on the charging route of the capacitor C3. The periodical method can obtain a great resistance-capacitance (RC) time delay. Accordingly, the reduction of resistance and capacitor area can obtain a desired RC time delay.

In this embodiment, the charging/discharging unit 340 further comprises a P-type transistor T6. The gate of the transistor T6 is coupled to the system voltage VDD. During the period of power-on, the transistor T6 is cut off. When the power is turned off, because the capacitor C3 stores charges at the period of turning on the power, the source-gate voltage of the transistor T6 is larger than the threshold voltage and thus the transistor T6 is turned on. Due to the discharge of the transistor T6 route, the capacitor C3 is back to its initial state.

The output circuit 350, such as an inverter in this embodiment, receives the storage voltage 342 of the capacitor C3. At the beginning of the turn-on of the power, because the storage voltage 342 does not reach the threshold voltage of the circuit 350, the voltage of the output reset signal RST is high. When the storage voltage 342 reaches the threshold voltage of the circuit 350, the voltage of the output reset signal RST is low. Accordingly, the reset signal RST with a sufficient time is generated at the beginning of the turn-on of the power.

When the system voltage VDD temporarily drops for some reason, unexpected situations will happen to the system due to the low voltage. After the system voltage is back to the normal operational voltage, the system cannot normally work due to its internal signal errors. In order to prevent these errors, the reset signal must be generated to reset the initial status of the system when the system voltage VDD is back to the normal operational voltage from the abnormal operational voltage.

Figure 3B:
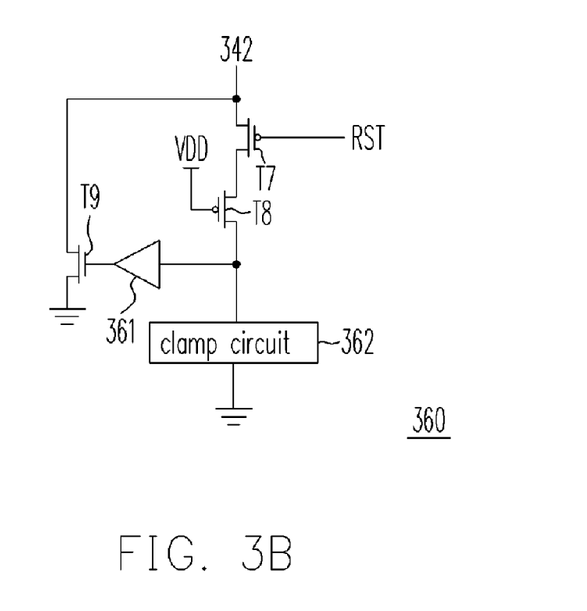
FIG. 3B is a low-voltage reset circuit according to an embodiment of the present invention.

FIG. 3B is a low-voltage reset circuit according to an embodiment of the present invention. Referring to FIGS. 3A and 3B, the low-voltage reset circuit 360 comprises P-type transistors T7 and T8, an N-type transistor T9, a buffer 361, and a clamp circuit 362. The low-voltage reset circuit 360 receives the reset signal RST and the storage voltage 342 of the capacitor C3. At the beginning of the turn-on of the power, because the reset signal RST is high, the transistor T7 is cut off.

By periodically charging the capacitor C3, the storage voltage 342 reaches the threshold voltage of the output circuit 350. The reset signal RST becomes low so that the transistor T7 is turned on during the normal operation, i.e., the normal operational voltage range of the system voltage VDD. The transistor T8 is cut off due to the control of the system voltage VDD. As a result, the input and output signal levels of the buffer 361 are low. The transistor T9 is also cut off. When the system voltage VDD is lower than the pre-determined level, the transistors T7 and T8 are turned on, and the input and output signal levels of the buffer 361 become high. Accordingly, the transistor T9 is turned on. Because the transistor T9 provides an electrical route when turned on, the capacitor apparatus C3 proceeds discharging and is back to its initial state. When the system voltage VDD is back to the normal operational voltage from the abnormal voltage drop, the power-on reset circuit properly generates the reset signal so that the system can reset the initial state.

Figure 4:
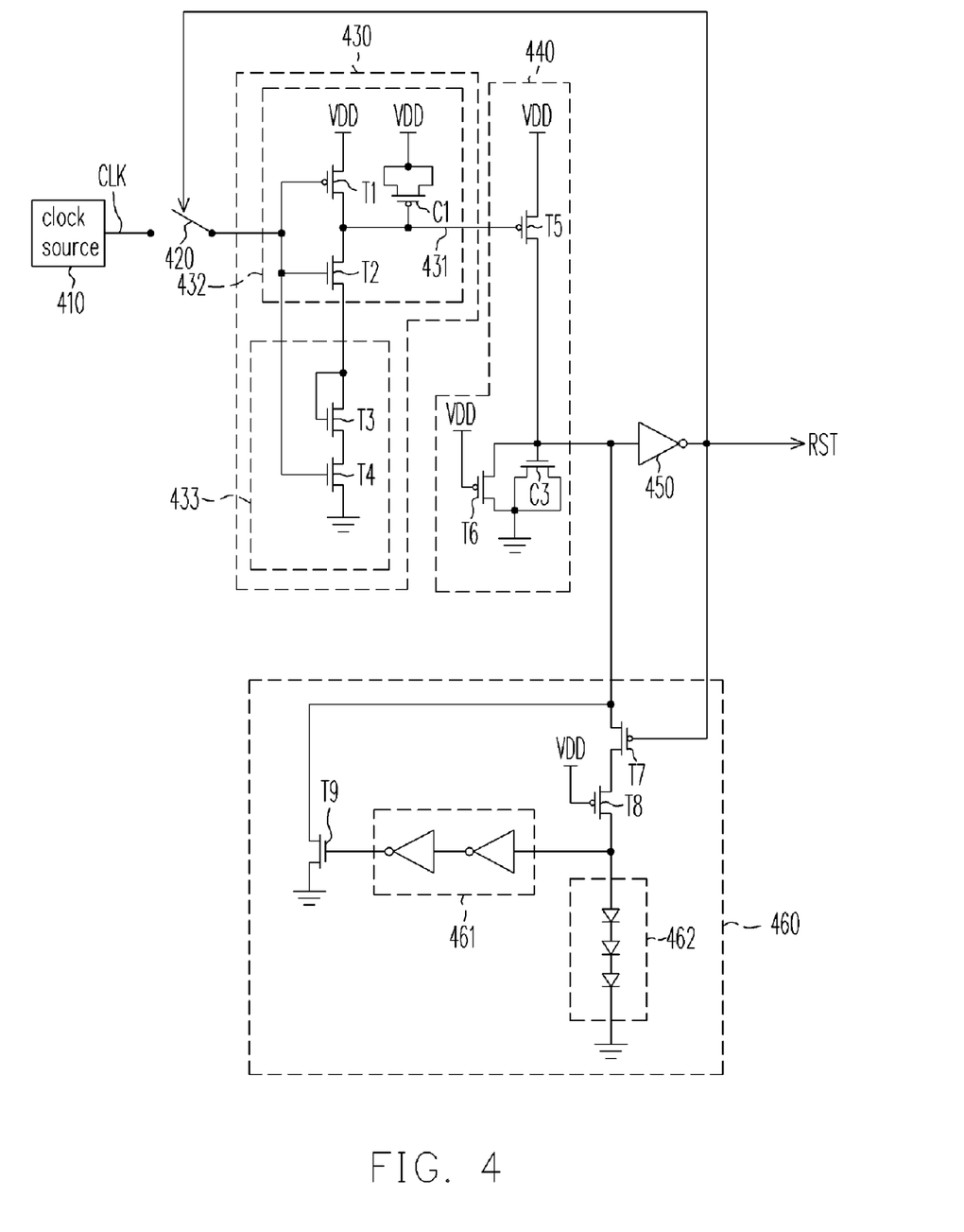
FIG. 4 is a drawing showing a power-on reset circuit according to an embodiment of the present invention.

In order to describe the present invention in detail, following are detailed descriptions of an embodiment of the present invention. FIG. 4 is a drawing showing a power-on reset circuit according to a preferred embodiment of the present invention. Referring to FIG. 4, the clock source 410, the control switch 420, and the output circuit 450 are similar to the clock source 310, the control switch 320, and the output circuit 350 in FIG. 3A, respectively. Detailed description is not repeated.

In this embodiment, the adjusting circuit 430 is similar to the adjusting circuit 330 in FIG. 3A comprising a wave-shaping circuit 432 and a clamp circuit 433. Wherein, the clamp circuit 433 can be the embodiment described below. The clamp circuit 433 comprises N-type transistors T3 and T4. The gate and the drain of the transistor T3 are coupled to the wave-shaping circuit 432. The drain of the transistor T4 is coupled to the source of the transistor T3. The source of the transistor T4 is coupled to the ground voltage. The gate of the transistor T4 receives the clock signal CLK.

The wave-shaping circuit 432 comprises a P-type transistor T1, an N-type transistor T2, and a capacitor C1. The gate of the transistor T1 receives the clock signal CLK, the source of the transistor T1 is coupled to the system voltage VDD, and the drain of the transistor T1 outputs a control signal 431. The gate of the transistor T2 receives the clock signal CLK, the drain of the transistor T2 is coupled to the drain of the transistor T1, and the source of the transistor T2 is coupled to the clamp circuit 433.

In this embodiment, the capacitor C1 is included in a P-type transistor to be integrated in the circuit. In other words, the source and the drain of the transistor are coupled as a terminal of the capacitor, and the gate is deemed as another terminal of the capacitor. A terminal of the capacitor C1 is coupled to the system voltage VDD and the other terminal is coupled to the drain of the transistor T1.

In this embodiment, the charging/discharging unit 440 is similar to the charging/discharging unit 340 in FIG. 3A. The difference is that the capacitor C3 is included in an N-type transistor. In other words, the gate of the N-type transistor is used as the first terminal of the capacitor, and the source and the drain are coupled and deemed as the second terminal of the capacitor.

The low-voltage reset circuit 460 is similar to the low-voltage reset circuit 360 in FIG. 3B. Detailed description is not repeated. Wherein, the buffer 461 comprises two inverters in series, and the clamp circuit 462 for example comprises three diodes in series.

Figure 5:
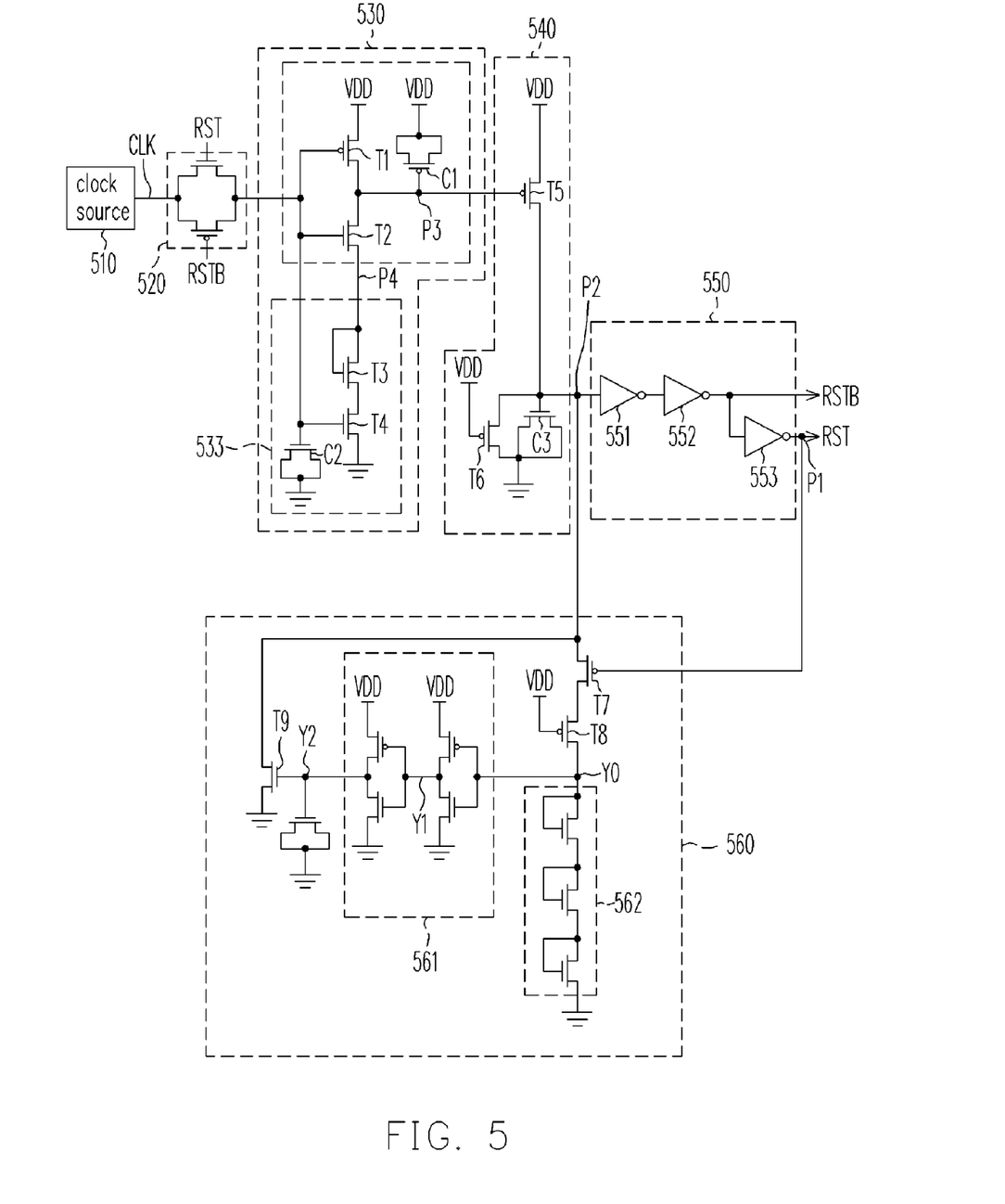
FIG. 5 is a drawing showing another power-on reset circuit according to an embodiment of the present invention.

FIG. 5 is a drawing showing another power-on reset circuit according to an embodiment of the present invention. The power-on reset circuit of FIG. 5 is similar to that of FIG. 4. Detailed description is not repeated. Referring to FIG. 5, the gate of the transistor T4 of the clamp circuit 533 of the adjusting circuit 530 is further coupled to the capacitor C2, which is included in an N-type transistor. It means that a terminal of the capacitor C2 is coupled to the gate of the transistor T4, and the other terminal of the capacitor C2 is grounded.

The output circuit 550 comprises inverters 551-553, for example. The buffer, which is composed of the inverters 551 and 552 in series, receives the storage voltage of the capacitor C3, i.e., the voltage at P2, to output the inversed reset voltage RSTB. The inverter 553 further receives the inversed reset voltage RSTB to output the reset voltage RST, i.e., the voltage at P1.

In this embodiment, the control switch 520 can be, for example, a transmission gate. Two gate terminals, i.e., control terminals, of the transmission gate separately receive the reset voltage RST and the inversed reset voltage RSTB so that the clock signal CLK can be transmitted to the adjusting circuit 530 at the beginning of the turn-on of the power until the reset voltage RST (RSTB) changes its state. Then, the transmission route of the clock signal CLK is turned off.

The low-voltage reset circuit 560 is similar to the low-voltage reset circuit 460 in FIG. 4. Wherein, the inverter of the buffer 561 is a Not gate composed of a P-type transistor and an N-type transistor. The diodes of the clamp circuit 562 are N-type transistors. It means that the drain and the gate of the N-type transistor are coupled to serve as a cathode of the diode, and the source of the N-type transistor serves as the anode of the diode.

Figure 6:
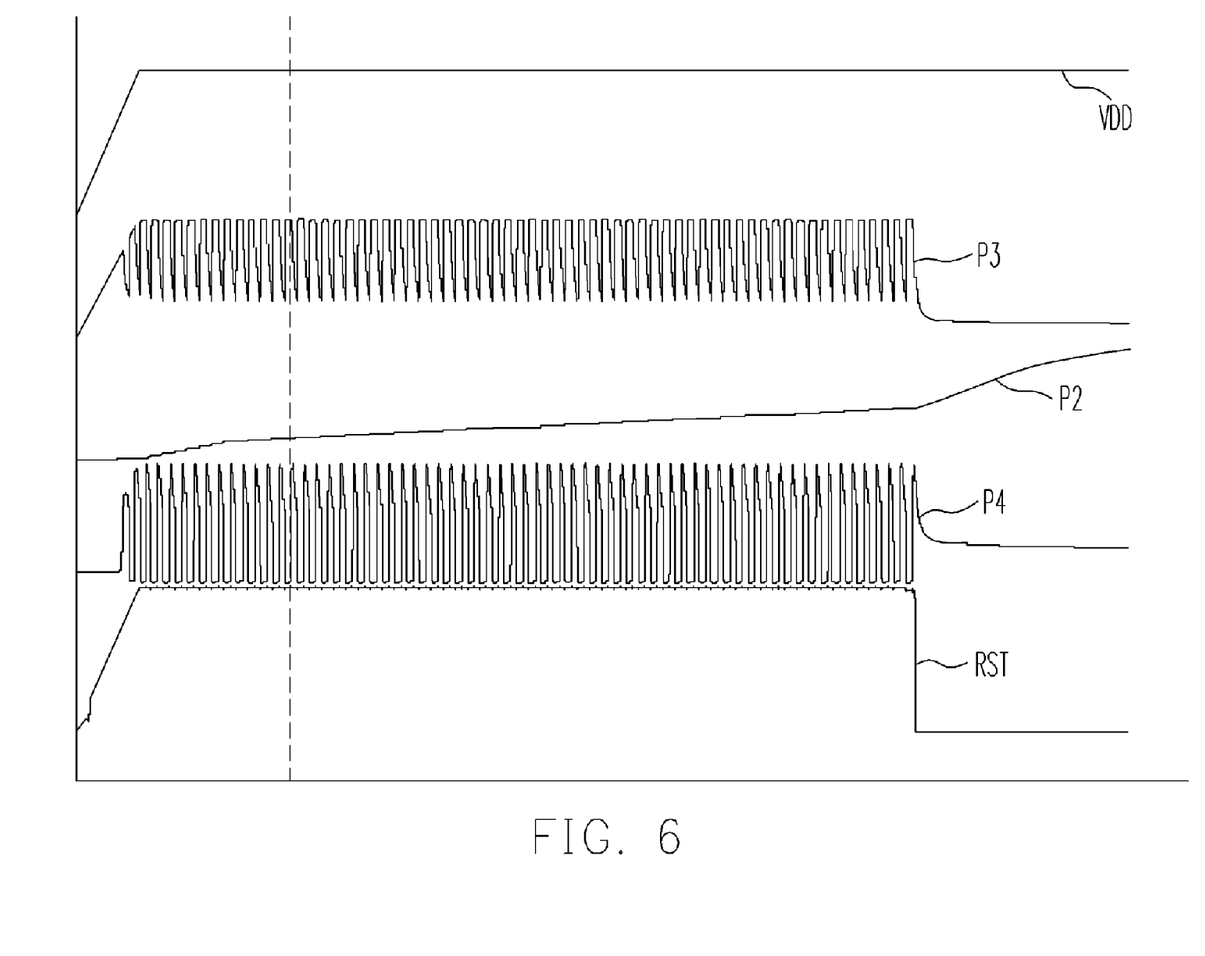
FIG. 6 is a drawing showing the sequences of the simulation signals of the power-on reset circuit in FIG. 5.

FIG. 6 is a drawing showing the sequences of the simulation signals of the power-on reset circuit in FIG. 5. From top to bottom, the first line represents the time sequence of the system voltage VDD. The second line represents the time sequence of the signal, i.e., the control signal, at point P3 in FIG. 5. The third line represents the time sequence of the signal, i.e., the storage voltage of the capacitor C3, at the point P2 in FIG. 5. The fourth line represents the time sequence of the signal, i.e., the clamp voltage, at the point P4 in FIG. 5. The bottom line represents the time sequence of the reset signal RST in FIG. 5.

Figure 7:
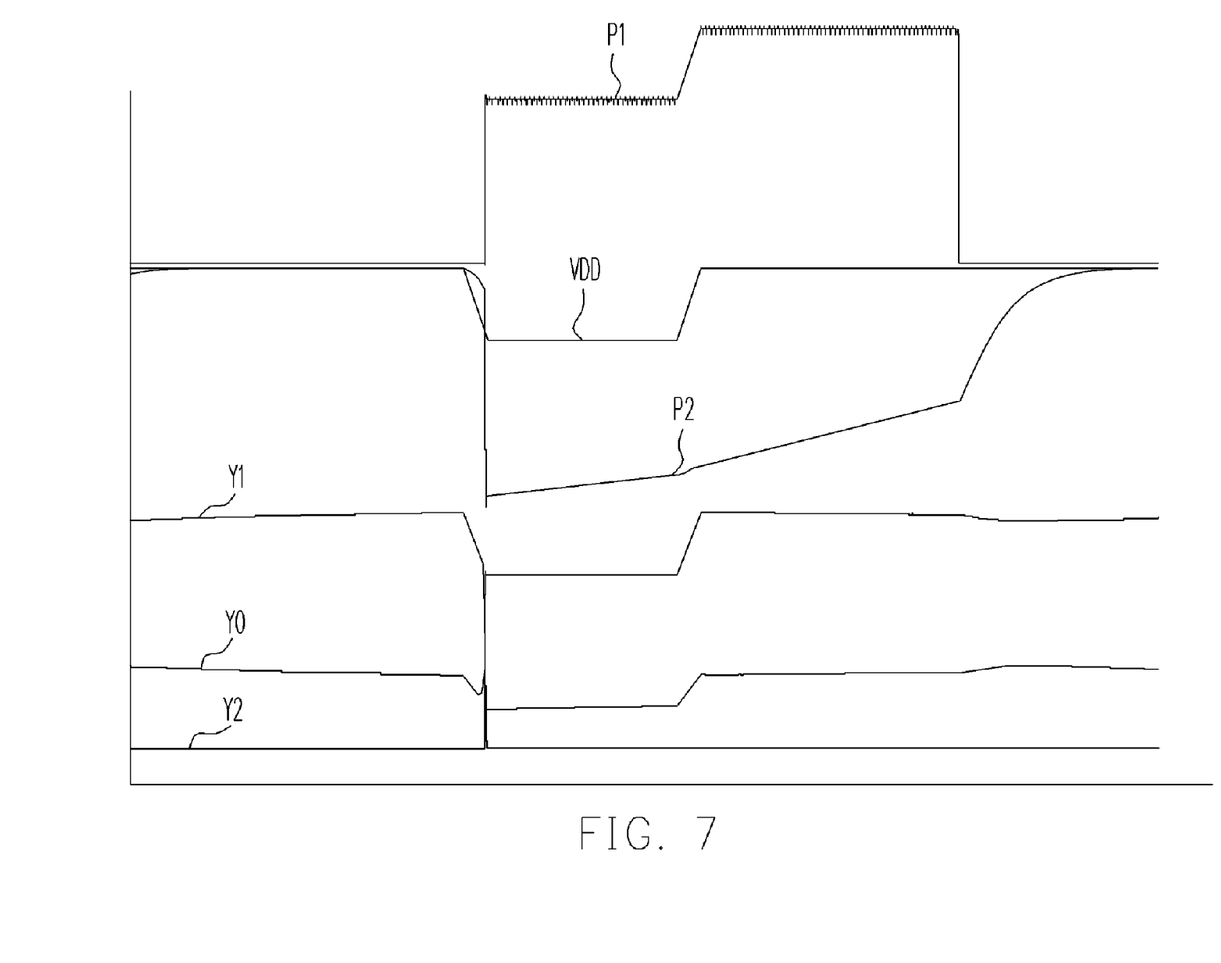
FIG. 7 is a drawing showing the sequences of the simulation signal of the power-on reset circuit in FIG. 5 when a sudden voltage drop of the power occurs.

FIG. 7 is a drawing showing the sequences of the simulation signal of the power-on reset circuit in FIG. 5 when the sudden voltage drop of the power occurs. From top to bottom, the first line represents the time sequence of the signal, i.e., the reset signal RST, at the point P1 in FIG. 5. The second line represents the time sequence of the system voltage VDD when it comes back to the original level from the voltage-drop level. The third line represents the time sequence of the signal, i.e., the storage voltage of the capacitor C3, at the point P2 in FIG. 5. The fourth to sixth lines represent the time sequences of the signals at the points Y1, Y0, and Y2, respectively.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A power-on reset circuit to generate a reset signal when a power is initially turned on, the power-on reset circuit comprising:
    an adjusting circuit receiving and adjusting a clock signal to output a control signal, wherein a lowest level of the control signal is higher than a pre-defined level;
    a charging/discharging unit having a capacitor apparatus, the charging/discharging unit being coupled to the adjusting circuit to receive the control signal and determine whether to charge or discharge the capacitor apparatus based on the control signal so as to output a storage voltage of the capacitor apparatus;
    an output circuit coupled to the charging/discharging unit to receive the storage voltage and output the reset signal, wherein the output circuit enables or disables the reset signal according to whether the storage voltage reaches a critical voltage of the output circuit;
    a control switch having a first terminal, a second terminal, and a control terminal, the control switch determines whether to transmit the clock signal received by the first terminal to the second terminal, and to output the clock signal to the adjusting circuit according to the reset signal received by the control terminal;
    and wherein the adjusting circuit determines a duty cycle of the charging/discharging unit by adjusting a waveform and the lowest level of the control signal.

2. The power-on reset circuit of claim 1, wherein the control switch is a transmission gate.

3. The power-on reset circuit of claim 1, wherein the adjusting circuit comprises:
    a wave-shaping circuit shaping the clock signal received by the wave-shaping circuit to output the control signal; and
    a first clamp circuit coupled to the wave-shaping circuit to restrain the lowest level of the control signal to be higher than the pre-determined level.

4. The power-on reset circuit of claim 3, wherein the wave-shaping circuit comprises:
    a first transistor, a gate of the first transistor receiving the clock signal, a first source/drain of the first transistor being coupled to a first voltage, a second source/drain of the first transistor outputting the control signal;
    a second transistor, a gate of the second transistor receiving the clock signal, a first source/drain of the second transistor being coupled to the second source/drain of the first transistor, a second source/drain of the second transistor being coupled to the first clamp circuit; and
    a first capacitor, a terminal of the first capacitor being coupled to the first voltage, another terminal of the first capacitor being coupled to the second source/drain of the first transistor.

5. The power-on reset circuit of claim 4, wherein the first transistor is a P-type transistor, and the second transistor is an N-type transistor.

6. The power-on reset circuit of claim 4, wherein the first voltage is a system voltage.

7. The power-on reset circuit of claim 3, wherein the first clamp circuit comprises:
a third transistor, a gate and a first source/drain of the third transistor being coupled to the wave-shaping circuit; and
a fourth transistor, a gate of the fourth transistor receiving the clock signal, a source/drain terminal of the fourth transistor being coupled to a second source/drain of the third transistor, a second source/drain of the fourth transistor being coupled to a second voltage.

8. The power-on reset circuit of claim 7, wherein the first clamp circuit further comprises:
a second capacitor, a terminal of the second capacitor receiving the clock signal, another terminal of the second capacitor being coupled to the second voltage.

9. The power-on reset circuit of claim 7, wherein the second voltage is a ground voltage.

10. The power-on reset circuit of claim 1, wherein the charging/discharging unit comprises:
a fifth transistor, a gate of the fifth transistor receiving the control signal, a first source/drain terminal of the fifth transistor being coupled to a first voltage;
a sixth transistor, a gate of the sixth transistor being coupled to the first voltage, a first source/drain of the sixth transistor being coupled to a second source/drain of the fifth transistor, a second source/drain terminal of the sixth transistor being coupled to a second voltage; and
a third capacitor, a first terminal of the third capacitor being coupled to the second source/drain of the fifth transistor, and outputting the storage voltage, a second terminal of the third capacitor being coupled to the second voltage.

11. The power-on reset circuit of claim 1, wherein the output circuit comprises at least one inverter.

12. The power-on reset circuit of claim 1, further comprising:
a low-voltage reset circuit receiving the reset signal and the storage voltage to provide an electrical route to charge/discharge the capacitor apparatus to come back to an initial condition of the capacitor apparatus when a system voltage is lower than a pre-determined level.

13. The power-on reset circuit of claim 12, wherein the low-voltage reset circuit comprises:
a seventh transistor, a gate of the seventh transistor receiving the reset signal, a first source/drain of the seventh transistor being coupled to the capacitor apparatus;
an eighth transistor, a gate of the eighth transistor receiving the first voltage, a first source/drain of the eight transistor being coupled to a second source/drain of the seventh transistor;
a ninth transistor, a first source/drain of the ninth transistor being coupled to the capacitor apparatus, a second source/drain of the ninth transistor being coupled to a second voltage;
a buffer, an input terminal of the buffer being coupled to a second source/drain of the eight transistor, an output terminal of the buffer being coupled to a gate of the ninth transistor; and
a second clamp circuit, a first terminal of the clamp circuit being coupled to the second source/drain of the eighth transistor, a second terminal of the second clamp circuit being coupled to the second voltage.

14. The power-on reset circuit of claim 13, wherein the seventh transistor and the eighth transistor are P-type transistors and the ninth transistor is an N-type transistor.

15. The power-on reset circuit of claim 13, wherein the second clamp circuit comprises a plurality of diodes in series.

16. The power-on reset circuit of claim 13, wherein the first voltage is a system voltage and the second voltage is a ground voltage.

* * * * *